(12) United States Patent
Ikisawa et al.

(10) Patent No.: US 9,663,405 B2
(45) Date of Patent: *May 30, 2017

(54) OXIDE SINTERED COMPACT, ITS PRODUCTION METHOD, AND RAW MATERIAL POWDER FOR PRODUCING OXIDE SINTERED COMPACT

(75) Inventors: Masakatsu Ikisawa, Ibaraki (JP); Masataka Yahagi, Ibaraki (JP); Kozo Osada, Ibaraki (JP); Takashi Kakeno, Ibaraki (JP); Hideo Takami, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 998 days.

This patent is subject to a terminal disclaimer.

(21) Appl. No.: 13/375,404

(22) PCT Filed: May 28, 2010

(86) PCT No.: PCT/JP2010/059101
§ 371 (c)(1),
(2), (4) Date: Jan. 12, 2012

(87) PCT Pub. No.: WO2010/140548
PCT Pub. Date: Dec. 9, 2010

(65) Prior Publication Data
US 2012/0103804 A1 May 3, 2012

(30) Foreign Application Priority Data
Jun. 5, 2009 (JP) ................. 2009-135806

(51) Int. Cl.
C04B 35/453 (2006.01)
C01G 15/00 (2006.01)
C04B 35/626 (2006.01)
C23C 14/08 (2006.01)
C23C 14/34 (2006.01)
H01B 1/08 (2006.01)

(52) U.S. Cl.
CPC .......... C04B 35/453 (2013.01); C01G 15/006 (2013.01); C04B 35/6261 (2013.01); C04B 35/62655 (2013.01); C04B 35/62675 (2013.01); C23C 14/086 (2013.01); C23C 14/3414 (2013.01); C01P 2006/12 (2013.01); C01P 2006/40 (2013.01); C01P 2006/80 (2013.01); C04B 2235/3284 (2013.01); C04B 2235/3286 (2013.01); C04B 2235/5409 (2013.01); C04B 2235/5436 (2013.01); C04B 2235/5445 (2013.01); C04B 2235/604 (2013.01); C04B 2235/656 (2013.01); C04B 2235/6585 (2013.01); C04B 2235/724 (2013.01); C04B 2235/77 (2013.01); H01B 1/08 (2013.01)

(58) Field of Classification Search
CPC .............................. C23C 14/3414; H01B 1/08
USPC ........................................................ 252/519.1
See application file for complete search history.

(56) References Cited

U.S. PATENT DOCUMENTS

| | | | |
|---|---|---|---|
| 6,099,982 A | 8/2000 | Okabe et al. | |
| 7,510,635 B2 | 3/2009 | Shindo et al. | |
| 7,674,404 B2 | 3/2010 | Osada | |
| 7,682,529 B2 | 3/2010 | Osada | |
| 7,686,985 B2 | 3/2010 | Osada | |
| 7,699,965 B2 | 4/2010 | Ikisawa et al. | |
| 7,868,326 B2 | 1/2011 | Sano et al. | |
| 8,007,693 B2 | 8/2011 | Ikisawa et al. | |
| 8,148,245 B2 * | 4/2012 | Ikisawa et al. | 438/482 |
| 2004/0180217 A1 | 9/2004 | Inoue et al. | |
| 2006/0113539 A1 | 6/2006 | Sano et al. | |
| 2008/0038929 A1 | 2/2008 | Chang | |
| 2009/0008638 A1 | 1/2009 | Kang et al. | |
| 2010/0108502 A1 | 5/2010 | Inoue et al. | |
| 2010/0140570 A1 | 6/2010 | Ikisawa et al. | |
| 2010/0189636 A1 | 7/2010 | Ikisawa et al. | |
| 2010/0300878 A1 | 12/2010 | Osada et al. | |
| 2011/0079754 A1* | 4/2011 | Hsieh | B82Y 30/00 252/519.33 |

FOREIGN PATENT DOCUMENTS

| | | |
|---|---|---|
| JP | H10-338522 A | 12/1998 |
| JP | H11-322335 A | 11/1999 |

(Continued)

OTHER PUBLICATIONS

Japan Society for the Promotion of Science, "Technology of Transparent Conductive Oxide Thin-Films", revised 2nd edition, The 166th Committee on Photonic and Electronic Oxide, pp. 235-236, Dec. 20, 2006.
Y-K Moon et al, "Application of DC Magnetron Sputtering to Deposition of InGaZnO Films for Thin Film Transistor Devices", Japanese Journal of Applied Physics, vol. 48, Mar. 23, 2009.

(Continued)

Primary Examiner — William Young
(74) Attorney, Agent, or Firm — Howson & Howson LLP

(57) ABSTRACT

An oxide sintered compact made of indium (In), gallium (Ga), zinc (Zn) and oxygen (O) and represented by a formula of $In_xGa_yZn_zO_a$ [wherein $x/(x+y)$ is 0.2 to 0.8, $z/(x+y+z)$ is 0.1 to 0.5, and $a=(3/2)x+(3/2)y+z$], wherein the concentration of volatile impurities contained in the oxide sintered compact is 20 ppm or less. Provided is technology for application to the production of an IGZO target capable of achieving high densification and low bulk resistance of the sputtering target, preventing swelling and cracks of the target during the production process, minimizing the generation of nodules, inhibiting abnormal discharge, and enabling DC sputtering.

3 Claims, No Drawings

(56) References Cited

FOREIGN PATENT DOCUMENTS

| JP | 2000-283941 A | 10/2000 |
|----|---------------|---------|
| JP | 2002-020122 A | 1/2002 |
| JP | 2004-142969 A | 5/2004 |
| JP | 2007-073312 A | 3/2007 |
| JP | 2007-223849 A | 9/2007 |
| JP | 2008-308385 A | 12/2008 |
| JP | 2009-029694 A | 2/2009 |
| JP | 2009-114013 A | 5/2009 |

OTHER PUBLICATIONS

K. Nomura et al., "Room-Temperature Fabrication of Transparent Flexible Thin-Film Transistors using Amorphous Oxide Semiconductors", Nature, vol. 432, pp. 488-492, Nov. 25, 2004 (Abstract Only).

* cited by examiner

OXIDE SINTERED COMPACT, ITS PRODUCTION METHOD, AND RAW MATERIAL POWDER FOR PRODUCING OXIDE SINTERED COMPACT

BACKGROUND OF THE INVENTION

The present invention relates to an IGZO oxide sintered compact that is used as a sputtering target upon producing, via the sputtering method, a transparent semiconductor IGZO film for use as an active layer or the like of a thin film transistor in a liquid crystal display device or an organic EL display device, its production method, and oxide powder that is used as the raw material for producing such an oxide sintered compact.

A thin film transistor which uses, as its active layer, a silicon-based material for driving the respective matrixes is used in a display element of an active matrix-type liquid crystal display device and the like, but the development of a thin film transistor using a transparent oxide semiconductor is being carried out in recent years due to drawbacks such as the reduction of the aperture ratio caused by the light-shielding layer for preventing the absorption of visible light, and the necessity to perform the deposition at a high temperature.

The transparent oxide semiconductor is attracting attention from the perspective of enabling low temperature deposition, high mobility and so on. Since the mobility of an amorphous IGZO film made from an In—Ga—Zn—O-based material (hereinafter referred to as the "IGZO") having indium, gallium, zinc, and oxygen as its constituent elements is higher than the mobility of amorphous silicon, and a field-effect transistor using such amorphous IGZO film as the active layer has high expectations since it possesses favorable characteristics such as the ON/OFF ratio being high (refer to Non-Patent Document 1 and Patent Document 1).

As the method of preparing an amorphous IGZO film, the sputtering method having superior mass productivity is most appropriate, and the IGZO target needs to have high density in order to use the sputtering method.

Nevertheless, although there were cases where a high density IGZO target could be produced, the density of the sintered compact would decrease while the production is ongoing, and, if production is further continued, it was possible to achieve a high density target again. The reason for this was considered to be inappropriate target production conditions such as the sintering conditions, but ultimately the cause remains unknown.

Meanwhile, the following examples have been previously reported as the types of impurity concentration and tolerable concentration in the oxide sintered compact target.

Patent Document 2 describes a method of producing an indium oxide-based sputtering target using indium oxide powder having a chlorine concentration of 50 wtppm or less. Nevertheless, this specification only discloses the effect of the chlorine concentration contained in the indium oxide powder.

Patent Document 3 describes indium oxide powder having low halogen content, however, in the Examples, only indium nitrate is used as the raw material.

In other words, the only report concerning the impurities in the oxide sintered compact target in the prior art documents relates to chlorine or the like contained in the indium oxide powder, and there is no report concerning the influence that the type or concentration of impurities contained in gallium oxide ($Ga_2O_3$) as the raw material of the IGZO transparent semiconductor target disclosed in the present invention has on the sintered compact density.

[Patent Document 1] Japanese Unexamined Patent Application Publication No. 2006-173580
[Patent Document 2] Japanese Unexamined Patent Application Publication No. 2008-308385
[Patent Document 3] Japanese Unexamined Patent Application Publication No. H10-182150
[Non-Patent Document 1] K. Nomura et al. "Room-temperature fabrication of transparent flexible thin-film transistors using amorphous oxide semiconductors", Nature, 432, p 488-492 (2004)

SUMMARY OF THE INVENTION

The present invention was devised in light of the foregoing circumstances, and its object is to provide a method of producing, with high density, an IGZO target for use as a sputtering target that is required for the deposition of a transparent semiconductor IGZO film based on the sputtering method, an IGZO sintered compact that is obtained from the foregoing production method, and an oxide raw material powder having a low impurity concentration that is suitable as a raw material for producing such an IGZO sintered compact.

The present inventors conducted intense study on a sputtering target for producing a transparent semiconductor film mainly having indium, gallium, zinc and oxygen as its constituent elements, and on the cause of problems such as the rupture, swelling and decrease in density of the sintered compact which occur during the sintering of an oxide sintered compact in which the concentration ratio of these elements is within a predetermined range. Consequently, the present inventors discovered that these problems are correlated to the concentration of specific impurities contained in the oxide powder as the raw material, and thereby completed this invention.

The present invention that was completed based on the foregoing discovery can be identified as follows:

1) An oxide sintered compact made of indium (In), gallium (Ga), zinc (Zn) and oxygen (O) and represented by a formula of $In_xGa_yZn_zO_a$ [wherein $x/(x+y)$ is 0.2 to 0.8, $z/(x+y+z)$ is 0.1 to 0.5, and $a=(3/2)x+(3/2)y+z$], wherein the concentration of volatile impurities contained in the oxide sintered compact is 20 ppm or less.
2) The oxide sintered compact according to paragraph 1) above, wherein the volatile impurities are a compound containing one or more compounds selected from a chlorine compound, a nitric acid compound, a sulfated compound, and an ammonium compound.
3) The oxide sintered compact according to paragraph 1) or paragraph 2) above, wherein the volatile impurities are a chlorine compound.
4) The oxide sintered compact according to paragraph 1) to 3) above, wherein the volatile impurities are a compound of chlorine and gallium.
5) The oxide sintered compact according to paragraph 1) to 4) above, wherein the relative density is 95% or higher and the bulk resistance value is $5.0 \times 10^{-2}$ Ωcm or less.
6) The oxide sintered compact according to paragraph 5) above, wherein the relative density is 98% or higher.
7) The oxide sintered compact according to paragraph 5) above, wherein the relative density is 99% or higher.
8) A method of producing an oxide sintered compact made of indium (In), gallium (Ga), zinc (Zn) and oxygen (O) and represented by a formula of $In_xGa_yZn_zO_a$ [wherein $x/(x+y)$ is 0.2 to 0.8, $z/(x+y+z)$ is 0.1 to 0.5, and $a=(3/2)$ x+(3/2)y+z], wherein indium oxide, gallium oxide and zinc oxide raw material powders respectively having a volatile impurity concentration of 20 ppm or less are used and sintered.

9) The method of producing an oxide sintered compact according to paragraph 8) above, wherein the volatile impurities are a compound containing one or more compounds selected from a chlorine compound, a nitric acid compound, a sulfated compound, and an ammonium compound.

10) The method of producing an oxide sintered compact according to paragraph 8) or paragraph 9) above, wherein the volatile impurities are a chlorine compound.

11) The method of producing an oxide sintered compact according to any one of paragraphs 8) to 10) above, wherein the volatile impurities are a compound of chlorine and gallium.

12) A raw material powder for producing an oxide sintered compact made from indium oxide, gallium oxide and zinc oxide powders respectively having a volatile impurity concentration of 20 ppm or less.

13) The raw material powder for producing an oxide sintered compact according to paragraph 12) above, wherein the volatile impurities are a compound containing one or more compounds selected from a chlorine compound, a nitric acid compound, a sulfated compound, and an ammonium compound.

14) The raw material powder for producing an oxide sintered compact according to paragraph 12) or paragraph 13) above, wherein the volatile impurities are a chlorine compound.

15) The raw material powder for producing an oxide sintered compact according to any one of paragraphs 12) to 14) above, wherein the volatile impurities are a compound of chlorine and gallium.

As described above, since the present invention can provide a method of producing a high density IGZO oxide sintered compact for use as a sputtering target to be used in producing a transparent semiconductor IGZO film, as well as the actual sintered compact, as a result of performing sputtering deposition using the foregoing high density IGZO oxide sintered compact, it is possible to prepare a favorable transparent semiconductor IGZO film to become the active layer of the thin film transistor in a liquid crystal display element or organic EL display element, which is driven by an active matrix, without any abnormal discharge such as arcing or any adverse effect such as the generation of nodules on the surface even when used for a long period.

DETAILED DESCRIPTION OF THE INVENTION

The subject matter of the present invention; specifically, the meaning of the terminology which defines the invention and grounds for setting the scope of features of the invention are now explained in detail.

The oxide sintered compact used in the present invention has indium (In), gallium (Ga), zinc (Zn) and oxygen (O) as its constituent elements. The four types of elements among the elements contained in the oxide sintered compact are of high concentration compared to the other elements, and this means that these elements are of an extremely high concentration compared to the concentration of impurities that gets mixed in during the course of preparing the sintered compact or that gets mixed from the raw materials.

The oxide sintered compact according to the present invention is made of indium (In), gallium (Ga), zinc (Zn) and oxygen (O) and represented by a formula of $In_xGa_yZn_zO_a$ [wherein x/(x+y) is 0.2 to 0.8, z/(x+y+z) is 0.1 to 0.5, and a=(3/2)x+(3/2)y+z], and, for example, can be represented as $InGaZnO_4$ when x:y:z=1:1:1 and as $In_2Ga_2ZnO_7$ when x:y:z=2:2:1.

When the atomic ratio x/(x+y) of indium relative to the total amount of indium and gallium exceeds 0.8, the carrier concentration of the film obtained via sputter deposition becomes too high, and the ON/OFF ratio as an important index of the thin film transistor characteristics which uses that film as an active layer will deteriorate. Meanwhile, when the indium ratio is less than 0.2, the carrier concentration of the film obtained via sputter deposition becomes too low and the mobility of the film will also deteriorate, and this is not preferable in terms of element characteristics.

Moreover, with the oxide sintered compact according to the present invention, when the atomic ratio z/(x+y+z) of zinc relative to the total amount of indium and gallium and zinc exceeds 0.5, the stability, moisture resistance and other characteristics of the film obtained via sputter deposition will deteriorate. Meanwhile, if this zinc ratio becomes less than 0.1, the amorphous nature of the film obtained via sputter deposition will weaken, and the film is more easily crystallized.

A crystallized film has great in-plane variations of its film characteristics, and causes variations of the element characteristics to increase. In addition, decrease of the Zn ratio means the increase of the total ratio of In and Ga, and, since these two metals are relatively expensive, cost of the oxide sintered compact will increase.

In the present specification, "a" indicates a case upon coinciding with the stoicheiometric composition, but the amount of oxygen in the oxide sintered compact of the present invention is normal when it deviates from the stoicheiometric composition and is subject to slight oxygen defect, and the present invention also covers an oxide sintered compact having such oxygen defect.

The term "impurities" as explained herein are elements other than indium, gallium, zinc, and oxygen contained in the indium oxide, gallium oxide, and zinc oxide which are used as the raw material, and the impurity concentration can be obtained based on the ICP (Inductively Coupled Plasma) analysis method.

The present invention evaluated the impurity concentration in the raw materials and oxide sintered compact by performing the ICP (Inductively Coupled Plasma) analysis method with model SPS3000 produced by SII NanoTechnology.

The expression "impurities are volatile" as explained herein refers to a state where the impurities become a gas state upon raising the temperature of the impurities and become separated from the raw material. Generally speaking, as the temperature of a substance is increased, there are substances which directly change from a solid to gas, and those which become gas after becoming a liquid, but they all ultimately become gas. Thus, it could be said that all substance are volatile, but hereinafter a volatile impurity means an impurity which is volatile and able to separate from the raw material at a temperature of 1500° C. or less, 1500° C. being the upper limit of the sintering temperature range for making the oxide sintered compact of the present invention.

The relative density of the oxide sintered compact of the present invention can reach 95% or higher, 98% or higher, and even 99% or higher. When the relative density of the oxide sintered compact is less than 95%, in addition to the variation of the carrier concentration of the film increasing, when sputter deposition is performed by using such oxide sintered compact as the sputtering target, there are disadvantages in that the number of generated nodules will increase pursuant to the lapse of the sputter time, the frequency of the occurrence of abnormal discharge will also increase, and the obtained film characteristics will deteriorate. Thus, the superiority of the present invention is obvious.

As the method of measuring the relative density of the oxide sintered compact, foremost, the value of density in which the relative density of the oxide sintered compact becomes 100% can be decided for the respective compositions based on the respective constituent elements and form, and, subsequently, the density of the actually prepared oxide sintered compact is obtained via the Archimedian method or the like, and the relative density can be obtained as the product of being divided by the value of the 100% density.

The crystal structure of the oxide sintered compact can be evaluated using an X-ray diffractometer. The present invention evaluated the crystal structure using the RINT-1100 X-ray diffractometer produced by Rigaku.

(Method of Producing Oxide Sintered Compact)

The following is a representative example of the process of producing the oxide sintered compact of the present invention described above.

As the raw material, indium oxide ($In_2O_3$), gallium oxide ($Ga_2O_3$), and zinc oxide (ZnO) can be used. In order to avoid adverse effects on the electrical characteristics caused by impurities, it is desirable to use raw materials having a purity of 4N or higher. The respective raw material powders are weighed to become the intended composition ratio. Note that, as described above, these shall not include unavoidable impurities.

Next, mixing and pulverization are performed. If pulverization is insufficient, the respective components become segregated in the produced target, and cause a high resistivity area and a low resistivity area to exist. Since charging at the high resistivity area during the sputter deposition will cause abnormal discharge such as arcing, mixing and pulverization must be performed sufficiently.

After mixing the respective raw materials with a super mixer, these are filled in an alumina sagger as needed, and calcined at a temperature range of 950 to 1350° C. The holding time of calcination is 2 to 10 hours, and it is performed in the atmosphere.

Next, if the amount of these raw materials is small, they are pulverized, for example, in 1000 g units as one batch using an attritor (zirconia beads having a diameter of 3 mm, and agitator rotation of 300 rpm) or an LMZ (Star Mill produced by Ashizawa Finetech) for roughly 2 to 5 hours.

If the amount of these raw materials is great, the raw materials are pulverized (zirconia beads having a diameter of 0.5 mm, and input power of 3.0 kW·Hr) in 30 kg units as once batch using an LMZ (Star Mill produced by Ashizawa Finetech) for roughly 2 to 5 hours.

Next, the slurry after pulverization is dried using a hot air drier at 100 to 150° C. for 5 to 48 hours, and sieved using a sieve with an opening of 250 μm to collect the powder. Note that the specific surface area of the respective powders is measured before and after the pulverization. 20 cc of a PVA aqueous solution (PVA solid content of 3%) is mixed to 1000 g of IGZO powder, and sieved using a sieve with an opening of 500 μm.

Next, 1000 g of powder is filled in a mold having a diameter of 210 mm, and pressed at a bearing 400 to 1000 kgf·cm² to obtain a compact. This compact is vacuum-packed in double with plastic, and subject to CIP at 1500 to 4000 kgf/cm². Subsequently, sintering is performed at a predetermined temperature (holding time of 5 to 24 hours in an oxygen atmosphere) to obtain a sintered compact.

Upon producing a target, by performing cylindrical grinding to the outer periphery and surface grinding to the side face of the oxide sintered compact obtained as described above, for example, a target of 152.4φ×5 tmm can be obtained. This is further bonded to, for example, a copper backing plate with indium-based alloy or the like as the bonding metal to obtain a sputtering target.

(Method of Producing Raw Material Oxide Powder)

In various methods adoptable as the method of producing the raw material oxide powder, neutralization is the most common method. For example, when producing gallium oxide powder, foremost, raw material gallium metal is dissolved in acid. As the acid for the foregoing dissolution, hydrochloric acid, nitric acid, sulfuric acid or mixed acid thereof can be used. The solution is thereafter neutralized in an alkaline solution.

As the alkaline solution for the foregoing neutralization, ammonia water, sodium hydroxide or the like can be used. Gallium hydroxide ($Ga(OH)_3$) becomes precipitated due to the neutralization, water molecules are thereafter removed from the gallium hydroxide, and changes into gallium oxyhydroxide (GaOOH).

Gallium oxide powder can be obtained by thoroughly washing and subsequently drying these hydroxides. The method of obtaining the raw material power of other raw materials including indium oxide and zinc oxide is basically the same.

In obtaining oxide powder based on neutralization as described above, if washing is not sufficiently performed in the washing process before drying, the impurities remaining in the solution will get mixed into the raw material oxide powder.

In particular, upon producing gallium oxide, when using hydrochloric acid as the acid and ammonia water as the alkaline solution, ammonium chloride tends to remain. If the raw material powder is fine, such powder tends to enter into the gap between the clumps of raw material powder or into the fine pores of the raw material powder itself. The impurities cannot be removed easily with the simple washing process using deionized water. It will require much time and labor to sufficiently eliminate the impurities.

Based on conventional knowledge, it was considered that the residual impurity concentration, particularly the volatile impurities would not have an adverse effect on sintering since they will become separated at a relatively low temperature in the sintering process when used as the raw material of an oxide sintered compact. In fact, since there are volatile impurities that become separated at a relatively low temperature, hardly any consideration was given to prescribing the residual impurity concentration.

Among the volatile impurities, the present invention discovered for the first time that there are compounds such as gallium chloride ($GaCl_3$) which become separated only after exceeding 1300° C., for instance. Even with compounds that become gasified and separated at a relatively low temperature as a simple substance, there are those which become separated only after reaching a higher temperature in a state when they are attached to the oxide raw material powder and remain in fine pores. In particular, harmful gallium chloride ($GaCl_3$) remains in the raw material $Ga_2O_3$. There will be no problem if this gallium chloride is volatilized during the sintering, but it is a substance that is not easily volatilized having a vapor pressure of roughly one atmosphere even in the vicinity of the sintering temperature.

Thus, it could be said that the total amount of gallium chloride ($GaCl_3$) contained in the raw material powder is desirably reduced at the stage of blending the raw material powder.

The following methods can be proposed as specific methods of lowering the concentration of chloride.

a) Method of sufficiently washing the gallium oxide precursor (gallium hydroxide). Specifically, gallium hydroxide is washed in 20 parts deionized water relative to the amount of powder, and thereafter roasted at 1000° C. Consequently, the chloride concentration will decrease to 200 wtppm.

b) Method of performing heat treatment on setting the roasting temperature to be 1200° C. or higher upon oxidation from gallium hydroxide to gallium oxide. Specifically, the chloride concentration is reduced to 10 wtppm or less by washing gallium hydroxide in 20 parts deionized water relative to the amount of powder, and roasting this at a roasting temperature of 1200° C. Thus, the chloride concentration can be lowered by performing sufficient water washing and performing heat treatment at a high roasting temperature.

Meanwhile, the elimination of impurities adhering to the raw material powder can be promoted by adding ultrasonic vibration of adding to or performing nitrogen gas bubbling in the container in the process of the washing which is made prior to drying the raw material powder. Contrarily, the residual impurity concentration can be increased by intentionally performing the washing process insufficiently. The oxide raw material powders with a high impurity concentration to be used in the present Comparative Examples are prepared in such a way as described just above.

EXAMPLES

The present invention is now explained with reference to the Examples and Comparative Examples. Note that the Examples are illustrative only, and the present invention is not limited in any way by these Examples. In other words, the present invention is limited only by the scope of claims, and covers the various modifications other than the Examples contained in the present invention.

The raw material powders that were used in the Examples are as shown in Table 1. These raw materials were blended so that the IGZO will be, based on a metal ratio, In:Ga:Zn=2:2:1 (based on a molar ratio, $In_2O_3$:$Ga_2O_3$:$ZnO$=1:1:1) or In:Ga:Zn=1:1:1 (based on a molar ratio, $In_2O_3$:$Ga_2O_3$:$ZnO$=1:1:2), targets were prepared by changing the raw material combination and manufacturing conditions (pulverization, calcination temperature, sintering temperature), and various tests were conducted. The details are shown in Example 1 to Example 7 of Table 2.

Note that the molar compounding ratio (1:1:1) shows the typical IGZO target. In order to prevent the generation of nodules in the intended target of the present invention, the compounding ratio of IGZO will not be a particular problem, but the raw materials were blended so achieve $In_2O_3$:$Ga_2O_3$:$ZnO$=1:1:1 in Examples 1 to 6.

Various types of analysis, measurement and evaluation are required in the following Examples and Comparative Examples, and the conditions and devices used are indicated below.

(Measurement of Particle Size)

This was performed using a particle size analyzer (Microtrac MT3000 produced by Nikkiso).

(Measurement of Chlorine Concentration)

This was performed using a chlorine/sulfur analyzer (TOX-2100H produced by Mitsubishi Chemical Analytech).

(Measurement of Density)

This was performed based on the Archimedian method using deionized water as the solvent. As the theoretical density that was used for calculating the relative density, the density that is reported in the JCPDS card was cited ($In_2Ga_2ZnO_7$ (card number: 381097) for In:Ga:Zn=2:2:1, $InGaZnO_4$ (card number: 381104) for In:Ga:Zn=1:1:1).

(Measurement of Bulk Resistance Value)

This was performed based on the four probe method using a resistivity processor (Σ-5+ produced by NPS).

(Measurement of Specific Surface Area)

Measurement of the specific surface area (BET) was performed using an automatic surface area measurement Beta THORP (MODEL-4200 produced by Nikkiso).

(Sputtering Conditions)

The test pieces of the prepared targets were sputtered with the sputtering conditions shown in Table 3, and the generation of nodules was visually observed.

TABLE 1

List of raw materials that were used

| | Particle size (μm) | Specific surface area (m$^2$/g) | Cl concentration (wtppm) |
|---|---|---|---|
| $In_2O_3$ (1) | 10.7 | 4.4 | <10 |
| $In_2O_3$ (2) | 0.7 | 13.7 | <10 |
| $Ga_2O_3$ (1) | 5.6 | 9.1 | 18 |
| $Ga_2O_3$ (2) | 4.6 | 11.9 | 12 |
| $Ga_2O_3$ (3) | 4.2 | 9.3 | <10 |
| $Ga_2O_3$ (4) | 3.0 | 9.4 | 156 |
| $Ga_2O_3$ (5) | 3.2 | 9.6 | 300 |
| ZnO (1) | 1.1 | 3.8 | <10 |

TABLE 2

List of Examples

| | Example 1 | Example 2 | Example 3 | Example 4 | Example 5 | Example 6 | Example 7 | Example 8 |
|---|---|---|---|---|---|---|---|---|
| Composition (metal ratio) | 2:2:1 | 2:2:1 | 2:2:1 | 2:2:1 | 2:2:1 | 2:2:1 | 1:1:1 | 1:1:1 |
| $In_2O_3$ raw material | (1) | (1) | (1) | (1) | (2) | (2) | (1) | (1) |
| $Ga_2O_3$ raw material | (1) | (1) | (1) | (2) | (2) | (2) | (3) | (3) |
| ZnO raw material | (1) | (1) | (1) | (1) | (1) | (1) | (1) | (1) |
| Calcination temperature | None | 950 | 950 | 950 | None | None | None | None |
| Pulverized amount | 2 kg | 30 kg | 30 kg | 2 kg | 2 kg | 2 kg | 2 kg | 30 kg |
| Pulverizing mill | Attritor | Beads mill | Beads mill | Attritor | Attritor | Attritor | Attritor | Beads mill |
| Pre-pulverization BET (m$^2$/g) | 6.0 | 2.6 | 2.6 | 3.1 | 13.8 | 13.8 | 1.7 | 1.7 |
| Post-pulverization BET (m$^2$/g) | 17.8 | 17.0 | 17.0 | 14.7 | 22.1 | 22.1 | 11.5 | 11.5 |

TABLE 2-continued

List of Examples

|  | Example 1 | Example 2 | Example 3 | Example 4 | Example 5 | Example 6 | Example 7 | Example 8 |
|---|---|---|---|---|---|---|---|---|
| Granulating powder chlorine concentration (ppm) | 14 | 13 | 11 | <10 | <10 | <10 | <10 | <10 |
| Mold (mm) | φ135 | 292 × 393 | 292 × 393 | φ135 | φ135 | φ135 | φ135 | 400 × 420 |
| Sintering temperature | 1450 | 1300 | 1450 | 1450 | 1400 | 1450 | 1490 | 1490 |
| Density (g/cm$^3$) | 6.20 | 6.46 | 6.22 | 6.26 | 6.48 | 6.44 | 6.34 | 6.27 |
| Relative density (%) | 95.5 | 99.5 | 95.8 | 96.4 | 99.8 | 99.2 | 99.4 | 98.3 |
| Bulk resistance value (mΩ · cm) | 3.0 | 5.2 | 2.2 | 6.0 | 4.0 | 2.6 | 18.0 | 24.0 |

The chlorine concentration of the sintered compact in the Examples was not greater than the detection limit (less than 10 ppm).
LMZ (product name) manufactured by Ashizawa Finetech Ltd. was used as the beads mill.
2:2:1 composition theoretical density: 6.495 g/cm$^3$
1:1:1 composition theoretical density: 6.379 g/cm$^3$

TABLE 3

| Sputter gas | Ar: 100% |
|---|---|
| Sputter gas pressure | 0.5 Pa |
| Input power | 500 W |
| Input power amount | 20 kWh |
| Substrate temperature | Room temperature |

Example 1

In Example 1, In$_2$O$_3$ powder of (1) above having a particle size of 10.7 μm, a specific surface area of 4.4 m$^2$/g, and a chlorine concentration of <10 ppm was used as the In$_2$O$_3$ raw material, Ga$_2$O$_3$ powder of (1) above having a particle size of 5.6 μm, a specific surface area of 9.1 m$^2$/g, and a chlorine concentration of 18 ppm was used as the Ga$_2$O$_3$ raw material, and ZnO powder of (1) above having a particle size of 1.1 μm, a specific surface area of 3.8 m$^2$/g, and a chlorine concentration of <10 ppm was used as the ZnO raw material. These raw material powders were blended to achieve In:Ga:Zn=2:2:1 based on a metal ratio.

Subsequently, these powders were mixed without calcination. The specific surface area (BET) before pulverization was 6.0 m$^2$/g. And, the specific surface area (BET) after pulverization was 17.8 m$^2$/g. The difference was 10.8 m$^2$/g. In addition, details regarding the target manufacturing conditions such as the mixing, pulverization, calcination and sintering of the powder are shown in Table 2. Consequently, the chlorine concentration of the granulating powder was 14 ppm. Here, only the main conditions are indicated, and various measurements and evaluations were based on the methods described.

Sintering was performed at 1450° C. As a result of the above, in Example 1, the chlorine concentration of the sintered compact was not greater than the detection limit; namely less than 10 ppm. The density was 6.20 g/cm$^3$ and the relative density was 95.5% (the true density of the composition of Example 1 was 6.495 g/cm$^3$) and high density was achieved, and the bulk resistance value was 3.0 mΩ·cm and had a low bulk resistance value which sufficiently enables DC sputtering. Moreover, the generation of swelling and cracks of the IGZO sintered compact target of Example 1 could not be acknowledged.

As a result of performing DC sputtering under the foregoing conditions, the number of generated particles and nodules decreased, and abnormal discharge could hardly be acknowledged during the sputtering.

Example 2

In Example 2, In$_2$O$_3$ powder of (1) above having a particle size of 10.7 μm, a specific surface area of 4.4 m$^2$/g, and a chlorine concentration of <10 ppm was used as the In$_2$O$_3$ raw material, Ga$_2$O$_3$ powder of (1) above having a particle size of 5.6 μm, a specific surface area of 9.1 m$^2$/g, and a chlorine concentration of 18 ppm was used as the Ga$_2$O$_3$ raw material, and ZnO powder of (1) above having a particle size of 1.1 μm, a specific surface area of 3.8 m$^2$/g, and a chlorine concentration of <10 ppm was used as the ZnO raw material. These raw material powders were blended to achieve In:Ga:Zn=2:2:1 based on a metal ratio.

Subsequently, these powders were mixed, and calcined at 950° C. The specific surface area (BET) before pulverization was 2.6 m$^2$/g. Moreover, the specific surface area (BET) after pulverization was 17.0 m$^2$/g. The difference was 14.4 m$^2$/g. In addition, details regarding the target manufacturing conditions such as the mixing, pulverization, calcination and sintering of the powder are shown in Table 2.

The chlorine concentration of the granulating powder was 13 ppm. Here, only the main conditions are indicated, and other measurements and evaluations were based on the methods described.

Sintering was performed at 1300° C. As a result of the above, in Example 2, the chlorine concentration of the sintered compact was not greater than the detection limit; namely, less than 10 ppm. The density was 6.46 g/cm$^3$ and the relative density was 99.5% (the true density of the composition of Example 2 was 6.495 g/cm$^3$) and high density was achieved, and the bulk resistance value was 5.2 mΩ·cm and had a low bulk resistance value which sufficiently enables DC sputtering. Moreover, the generation of swelling and cracks of the IGZO sintered compact target of Example 2 could not be acknowledged.

As a result of performing DC sputtering under the foregoing conditions, the number of generated particles and nodules decreased, and abnormal discharge could hardly be acknowledged during the sputtering.

Example 3

In Example 3, In$_2$O$_3$ powder of (1) above having a particle size of 10.7 μm, a specific surface area of 4.4 m$^2$/g, and a chlorine concentration of <10 ppm was used as the In$_2$O$_3$ raw material, Ga$_2$O$_3$ powder of (1) above having a particle size of 5.6 μm, a specific surface area of 9.1 m$^2$/g, and a chlorine concentration of 18 ppm was used as the Ga$_2$O$_3$ raw material, and ZnO powder of (1) above having a particle size of 1.1 μm, a specific surface area of 3.8 m$^2$/g, and a chlorine concentration of <10 ppm was used as the ZnO raw material. These raw material powders were blended to achieve In:Ga:Zn=2:2:1 based on a metal ratio.

Subsequently, these powders were mixed, and calcined at 950° C. The specific surface area (BET) before pulverization was 2.6 m²/g. Moreover, the specific surface area (BET) after pulverization was 17.0 m²/g. The difference was 14.4 m²/g. In addition, details regarding the target manufacturing conditions such as the mixing, pulverization, calcination and sintering of the powder are shown in Table 2. The chlorine concentration of the granulating powder was 11 ppm.

Here, only the main conditions are indicated. And the various measurements and evaluations were based on the methods described.

Sintering was performed at 1450° C. As a result of the above, in Example 3, the chlorine concentration of the sintered compact was not greater than the detection limit; that is, namely, less than 10 ppm. The density was 6.22 g/cm³ and the relative density was 95.8% (the true density of the composition of Example 3 was 6.495 g/cm³) and high density was achieved, and the bulk resistance value was 2.2 mΩ·cm and had a low bulk resistance value which sufficiently enables DC sputtering. Moreover, the generation of swelling and cracks of the IGZO sintered compact target of Example 3 could not be acknowledged.

As a result of performing DC sputtering under the foregoing conditions, the number of generated particles and nodules decreased, and abnormal discharge could hardly be acknowledged during the sputtering.

Example 4

In Example 4, $In_2O_3$ powder of (1) above having a particle size of 10.7 μm, a specific surface area of 4.4 m²/g, and a chlorine concentration of <10 ppm was used as the $In_2O_3$ raw material, $Ga_2O_3$ powder of (2) above having a particle size of 4.6 μm, a specific surface area of 11.9 m²/g, and a chlorine concentration of 12 ppm was used as the $Ga_2O_3$ raw material, and ZnO powder of (1) above having a particle size of 1.1 μm, a specific surface area of 3.8 m²/g, and a chlorine concentration of <10 ppm was used as the ZnO raw material. These raw material powders were blended to achieve In:Ga:Zn=2:2:1 based on a metal ratio.

Subsequently, these powders were mixed, and calcined at 950° C. The specific surface area (BET) before pulverization was 3.1 m²/g. Moreover, the specific surface area (BET) after pulverization was 14.7 m²/g. The difference was 11.6 m²/g. In addition, details regarding the target manufacturing conditions such as the mixing, pulverization, calcination and sintering of the powder are shown in Table 2.

The chlorine concentration of the granulating powder was <10 ppm. Here, only the main conditions are indicated, and the various measurements and evaluations were based on the methods described.

Sintering was performed at 1450° C. As a result of the above, in Example 4, the chlorine concentration of the sintered compact was not greater than the detection limit; namely, less than 10 ppm. The density was 6.26 g/cm³ and the relative density was 96.4% (the true density of the composition of Example 4 was 6.495 g/cm³) and high density was achieved, and the bulk resistance value was 6.0 mΩ·cm and had a low bulk resistance value which sufficiently enables DC sputtering. Moreover, the generation of swelling and cracks of the IGZO sintered compact target of Example 4 could not be acknowledged.

As a result of performing DC sputtering under the foregoing conditions, the number of generated particles and nodules decreased, and abnormal discharge could hardly be acknowledged during the sputtering.

Example 5

In Example 5, $In_2O_3$ powder of (1) above having a particle size of 0.7 μm, a specific surface area of 13.7 m²/g, and a chlorine concentration of <10 ppm was used as the $In_2O_3$ raw material, $Ga_2O_3$ powder of (2) above having a particle size of 4.6 μm, a specific surface area of 11.9 m²/g, and a chlorine concentration of 12 ppm was used as the $Ga_2O_3$ raw material, and ZnO powder of (1) above having a particle size of 1.1 μm, a specific surface area of 3.8 m²/g, and a chlorine concentration of <10 ppm was used as the ZnO raw material. These raw material powders were blended to achieve In:Ga:Zn=2:2:1 based on a metal ratio.

Subsequently, these powders were mixed without calcination. The specific surface area (BET) before pulverization was 13.8 m²/g. Moreover, the specific surface area (BET) after pulverization was 22.1 m²/g. The difference was 8.3 m²/g. In addition, details regarding the target manufacturing conditions such as the mixing, pulverization, calcination and sintering of the powder are shown in Table 2.

The chlorine concentration of the granulating powder was <10 ppm. Here, only the main conditions are indicated, and the various measurements and evaluations were based on the methods described.

Sintering was performed at 1400° C. As a result of the above, in Example 5, the chlorine concentration of the sintered compact was not greater than the detection limit; namely, less than 10 ppm. The density was 6.48 g/cm³ and the relative density was 99.8% (the true density of the composition of Example 5 was 6.495 g/cm³) and high density was achieved, and the bulk resistance value was 4.0 mΩ·cm and had a low bulk resistance value which sufficiently enables DC sputtering. Moreover, the generation of swelling and cracks of the IGZO sintered compact target of Example 5 could not be acknowledged.

As a result of performing DC sputtering under the foregoing conditions, the number of generated particles and nodules decreased, and abnormal discharge could hardly be acknowledged during the sputtering.

Example 6

In Example 6, $In_2O_3$ powder of (1) above having a particle size of 0.7 μm, a specific surface area of 13.7 m²/g, and a chlorine concentration of <10 ppm was used as the $In_2O_3$ raw material, $Ga_2O_3$ powder of (2) above having a particle size of 4.6 μm, a specific surface area of 11.9 m²/g, and a chlorine concentration of 12 ppm was used as the $Ga_2O_3$ raw material, and ZnO powder of (1) above having a particle size of 1.1 μm, a specific surface area of 3.8 m²/g, and a chlorine concentration of <10 ppm was used as the ZnO raw material. These raw material powders were blended to achieve In:Ga:Zn=2:2:1 based on a metal ratio.

Subsequently, these powders were mixed without calcination. The specific surface area (BET) before pulverization was 13.8 m²/g. Moreover, the specific surface area (BET) after pulverization was 22.1 m²/g. The difference was 8.3 m²/g. In addition, details regarding the target manufacturing conditions such as the mixing, pulverization, calcination and sintering of the powder are shown in Table 2.

The chlorine concentration of the granulating powder was <10 ppm. Here, only the main conditions are indicated, and the various measurements and evaluations were based on the methods described.

Sintering was performed at 1450° C. As a result of the above, in Example 6, the chlorine concentration of the sintered compact was not greater than the detection limit; namely, less than 10 ppm. The density was 6.44 g/cm$^3$ and the relative density was 99.2% (the true density of the composition of Example 6 was 6.495 g/cm$^3$) and high density was achieved, and the bulk resistance value was 2.6 mΩ·cm and had a low bulk resistance value which sufficiently enables DC sputtering. Moreover, the generation of swelling and cracks of the IGZO sintered compact target of Example 6 could not be acknowledged.

As a result of performing DC sputtering under the foregoing conditions, the number of generated particles and nodules decreased, and abnormal discharge could hardly be acknowledged during the sputtering.

Example 7

In Example 7, In$_2$O$_3$ powder of (1) above having a particle size of 10.7 μm, a specific surface area of 4.4 m$^2$/g, and a chlorine concentration of <10 ppm was used as the In$_2$O$_3$ raw material, Ga$_2$O$_3$ powder of (3) above having a particle size of 4.2 μm, a specific surface area of 9.3 m$^2$/g, and a chlorine concentration of <10 ppm was used as the Ga$_2$O$_3$ raw material, and ZnO powder of (1) above having a particle size of 1.1 μm, a specific surface area of 3.8 m$^2$/g, and a chlorine concentration of <10 ppm was used as the ZnO raw material. These raw material powders were blended to achieve In:Ga:Zn=1:1:1 based on a metal ratio.

Subsequently, these powders were mixed without calcination. The specific surface area (BET) before pulverization was 1.7 m$^2$/g. Moreover, the specific surface area (BET) after pulverization was 11.5 m$^2$/g. The difference was 9.8 m$^2$/g. In addition, details regarding the target manufacturing conditions such as the mixing, pulverization, calcination and sintering of the powder are shown in Table 2.

The chlorine concentration of the granulating powder was <10 ppm. Here, only the main conditions are indicated, and the various measurements and evaluations were based on the methods described.

Sintering was performed at 1490° C. As a result of the above, in Example 7, the chlorine concentration of the sintered compact was not greater than the detection limit; namely, less than 10 ppm. The density was 6.34 g/cm$^3$ and the relative density was 99.4% (the true density of the composition of Example 7 was 6.379 g/cm$^3$) and high density was achieved, and the bulk resistance value was 18.0 mΩ·cm and had a low bulk resistance value which sufficiently enables DC sputtering.

Moreover, the generation of swelling and cracks of the IGZO sintered compact target of Example 7 could not be acknowledged.

As a result of performing DC sputtering under the foregoing conditions, the number of generated particles and nodules decreased, and abnormal discharge could hardly be acknowledged during the sputtering.

Example 8

In Example 8, In$_2$O$_3$ powder of (1) above having a particle size of 10.7 μm, a specific surface area of 4.4 m$^2$/g, and a chlorine concentration of <10 ppm was used as the In$_2$O$_3$ raw material, Ga$_2$O$_3$ powder of (3) above having a particle size of 4.2 μm, a specific surface area of 9.3 m$^2$/g, and a chlorine concentration of <10 ppm was used as the Ga$_2$O$_3$ raw material, and ZnO powder of (1) above having a particle size of 1.1 μm, a specific surface area of 3.8 m$^2$/g, and a chlorine concentration of <10 ppm was used as the ZnO raw material. These raw material powders were blended to achieve In:Ga:Zn=1:1:1 based on a metal ratio.

Subsequently, these powders were mixed without calcination. The specific surface area (BET) before pulverization was 1.7 m$^2$/g. Moreover, the specific surface area (BET) after pulverization was 11.5 m$^2$/g. The difference was 9.8 m$^2$/g. In addition, details regarding the target manufacturing conditions such as the mixing, pulverization, calcination and sintering of the powder are shown in Table 2.

The chlorine concentration of the granulating powder was <10 ppm. Here, only the main conditions are indicated, and the various measurements and evaluations were based on the methods described.

Sintering was performed at 1490° C. As a result of the above, in Example 8, the chlorine concentration of the sintered compact was not greater than the detection limit; namely, less than 10 ppm. The density was 6.27 g/cm$^3$ and the relative density was 98.3% (the true density of the composition of Example 8 was 6.379 g/cm$^3$) and high density was achieved, and the bulk resistance value was 24.0 mΩ·cm and had a low bulk resistance value which sufficiently enables DC sputtering. Moreover, the generation of swelling and cracks of the IGZO sintered compact target of Example 8 could not be acknowledged.

As a result of performing DC sputtering under the foregoing conditions, the number of generated particles and nodules decreased, and abnormal discharge could hardly be acknowledged during the sputtering.

Comparative Example 1

In Comparative Example 1, In$_2$O$_3$ powder of (1) above having a particle size of 10.7 μm, a specific surface area of 4.4 m$^2$/g, and a chlorine concentration of <10 ppm was used as the In$_2$O$_3$ raw material, Ga$_2$O$_3$ powder of (4) above having a particle size of 3.0 μm, a specific surface area of 9.4 m$^2$/g, and a chlorine concentration 156 ppm was used as the Ga$_2$O$_3$ raw material, and ZnO powder of (1) above having a particle size of 1.1 μm, a specific surface area of 3.8 m$^2$/g, and a chlorine concentration of <10 ppm was used as the ZnO raw material. These raw material powders were blended to achieve In:Ga:Zn=2:2:1 based on a metal ratio.

Subsequently, these powders were mixed without calcination. The specific surface area (BET) before pulverization was 2.6 m$^2$/g. Moreover, the specific surface area (BET) after pulverization was 17.0 m$^2$/g. The difference was 14.4 m$^2$/g. In addition, details regarding the target manufacturing conditions such as the mixing, pulverization, calcination and sintering of the powder are shown in Table 4.

The chlorine concentration of the granulating powder was 40 ppm. Here, only the main conditions are indicated, and the various measurements and evaluations were based on the methods described.

Sintering was performed at 1450° C. As a result of the above, in Comparative Example 1, the chlorine concentration of the sintered compact was 28 ppm, and failed to satisfy the conditions of the present invention. The density was 5.72 g/cm$^3$ and the relative density was 88.1% (the true density of the composition of Comparative Example 1 was 6.495 g/cm$^3$) and low density was achieved, and the bulk resistance value was not measured. It was impossible to perform DC sputtering. And numerous generation of swelling and cracks of the IGZO sintered compact target of Comparative Example 1 was acknowledged.

As a result of performing radio frequency (RF) sputtering with an inferior sputtering efficiency in substitute for the DC sputtering, the number of generated particles and nodules increased, and abnormal discharge was observed during the sputtering, as the results are shown in Table 4.

TABLE 4

List of Comparative Examples

|  | Comparative Example 1 | Comparative Example 2 | Comparative Example 3 | Comparative Example 4 |
|---|---|---|---|---|
| Composition | 2:2:1 | 2:2:1 | 2:2:1 | 1:1:1 |
| $In_2O_3$ raw material | (1) | (1) | (1) | (1) |
| $Ga_2O_3$ raw material | (4) | (4) | (5) | (5) |
| ZnO raw material | (1) | (1) | (1) | (1) |
| Calcination temperature | None | 950 | 950 | 1050 |
| Pulverized amount | 2 kg | 30 kg | 30 kg | 30 kg |
| Pulverizing mill | Attritor | Beads mill | Beads mill | Beads mill |
| Pre-pulverization BET (m²/g) | 2.6 | 3.3 | 3.2 | 1.7 |
| Post-pulverization BET (m²/g) | 17.0 | 10.2 | 11.4 | 8.3 |
| Granulating powder chlorine concentration (ppm) | 40 | 38 | 55 | 62 |
| Mold (mm) | φ135 | 292 × 393 | 292 × 393 | 400 × 420 |
| Sintering temperature | 1450 | 1450 | 1450 | 1490 |
| Density (g/cm³) | 5.72 | 5.63 | 5.52 | 5.8 |
| Relative density (%) | 88.1 | 86.7 | 85.0 | 90.9 |
| Bulk resistance value (mΩ · cm) | — | — | — | 58 |

LMZ (product name) manufactured by Ashizawa Finetech Ltd. was used as the beads mill.
2:2:1 composition theoretical density: 6.495 g/cm³
1:1:1 composition theoretical density: 6.379 g/cm³

Comparative Example 2

In Comparative Example 2, $In_2O_3$ powder of (1) above having a particle size of 10.7 μm, a specific surface area of 4.4 m²/g, and a chlorine concentration of <10 ppm was used as the $In_2O_3$ raw material, $Ga_2O_3$ powder of (4) above having a particle size of 3.0 μm, a specific surface area of 9.4 m²/g, and a chlorine concentration 156 ppm was used as the $Ga_2O_3$ raw material, and ZnO powder of (1) above having a particle size of 1.1 μm, a specific surface area of 3.8 m²/g, and a chlorine concentration of <10 ppm was used as the ZnO raw material. These raw material powders were blended to achieve In:Ga:Zn=2:2:1 based on a metal ratio.

Subsequently, these powders were mixed, and calcined at 950° C. The specific surface area (BET) before pulverization was 3.3 m²/g. Moreover, the specific surface area (BET) after pulverization was 10.2 m²/g. The difference was 6.9 m²/g. In addition, details regarding the target manufacturing conditions such as the mixing, pulverization, calcination and sintering of the powder are shown in Table 4.

The chlorine concentration of the granulating powder was 38 ppm. Here, only the main conditions are indicated, and the various measurements and evaluations were based on the methods described.

Sintering was performed at 1450° C. As a result of the above, in Comparative Example 2, the chlorine concentration of the sintered compact was 26 ppm, and failed to satisfy the conditions of the present invention. The density was 5.63 g/cm³ and the relative density was 86.7% (the true density of the composition of Comparative Example 2 was 6.495 g/cm³) and low density was achieved, and the bulk resistance value was not measured. It was impossible to perform DC sputtering. And numerous generation of swelling and cracks of the IGZO sintered compact target of Comparative Example 2 was acknowledged.

As a result of performing radio frequency (RF) sputtering with an inferior sputtering efficiency in substitute for the DC sputtering, the number of generated particles and nodules increased, and abnormal discharge was observed during the sputtering, as the results are shown in Table 4.

Comparative Example 3

In Comparative Example 3, $In_2O_3$ powder of (1) above having a particle size of 10.7 μm, a specific surface area of 4.4 m²/g, and a chlorine concentration of <10 ppm was used as the $In_2O_3$ raw material, $Ga_2O_3$ powder of (5) above having a particle size of 3.2 μm, a specific surface area of 9.6 m²/g, and a chlorine concentration 300 ppm was used as the $Ga_2O_3$ raw material, and ZnO powder of (1) above having a particle size of 1.1 μm, a specific surface area of 3.8 m²/g, and a chlorine concentration of <10 ppm was used as the ZnO raw material. These raw material powders were blended to achieve In:Ga:Zn=2:2:1 based on a metal ratio.

Subsequently, these powders were mixed, and calcined at 950° C. The specific surface area (BET) before pulverization was 3.2 m²/g. Moreover, the specific surface area (BET) after pulverization was 11.4 m²/g. The difference was 8.2 m²/g. In addition, details regarding the target manufacturing conditions such as the mixing, pulverization, calcination and sintering of the powder are shown in Table 4.

The chlorine concentration of the granulating powder was 55 ppm. Here, only the main conditions are indicated, and the various measurements and evaluations were based on the methods described.

Sintering was performed at 1450° C. As a result of the above, in Comparative Example 3, the chlorine concentration of the sintered compact was 35 ppm, and failed to satisfy the conditions of the present invention. The density was 5.63 g/cm³ and the relative density was 85.0% (the true density of the composition of Comparative Example 3 was 6.495 g/cm³) and low density was achieved, and the bulk resistance value was not measured. It was impossible to perform DC sputtering. And, numerous generation of swelling and cracks of the IGZO sintered compact target of Comparative Example 3 was acknowledged.

As a result of performing radio frequency (RF) sputtering with an inferior sputtering efficiency in substitute for the DC sputtering, the number of generated particles and nodules increased, and abnormal discharge was observed during the sputtering, as the results are shown in Table 4.

Comparative Example 4

In Comparative Example 4, $In_2O_3$ powder of (1) above having a particle size of 10.7 μm, a specific surface area of 4.4 m²/g, and a chlorine concentration of <10 ppm was used as the $In_2O_3$ raw material, $Ga_2O_3$ powder of (5) above having a particle size of 3.2 μm, a specific surface area of 9.6 m²/g, and a chlorine concentration 300 ppm was used as the $Ga_2O_3$ raw material, and ZnO powder of (1) above having a particle size of 1.1 μm, a specific surface area of 3.8 m$^2$/g, and a chlorine concentration of <10 ppm was used as the ZnO raw material. These raw material powders were blended to achieve In:Ga:Zn=1:1:1 based on a metal ratio.

Subsequently, these powders were mixed, and calcined at 1050° C. The specific surface area (BET) before pulverization was 1.7 m$^2$/g. Moreover, the specific surface area (BET) after pulverization was 8.3 m$^2$/g. The difference was 6.6 m$^2$/g. In addition, details regarding the target manufacturing conditions such as the mixing, pulverization, calcination and sintering of the powder are shown in Table 4.

The chlorine concentration of the granulating powder was 62 ppm. Here, only the main conditions are indicated, and the various measurements and evaluations were based on the methods described.

Sintering was performed at 1490° C. As a result of the above, in Comparative Example 5, the chlorine concentration of the sintered compact was 38 ppm, and failed to satisfy the conditions of the present invention.

The density was 5.80 g/cm$^3$ and the relative density was 90.9% (the true density of the composition of Comparative Example 4 was 6.379 g/cm$^3$) and, although high density was achieved, and the bulk resistance value was 58 mΩ·cm, it was difficult to perform DC sputtering. And numerous generation of swelling and cracks of the IGZO sintered compact target of Comparative Example 4 was acknowledged.

As a result of high-handedly performing DC sputtering, the number of generated particles and nodules increased, and abnormal discharge was observed during the sputtering as the results are shown in Table 4.

The present invention relates to an oxide sintered compact made of indium (In), gallium (Ga), zinc (Zn) and oxygen (O) and represented by a formula of InxGayZnzOa [wherein x/(x+y) is 0.2 to 0.8, z/(x+y+z) is 0.1 to 0.5, and a=(3/2)x+(3/2)y+z], wherein the concentration of volatile impurities contained in the oxide sintered compact is 20 ppm or less, as well as to the method of producing the same, and is capable of achieving high densification and low bulk resistance of the target, preventing swelling and cracks of the target in the production process, minimizing of the generation of nodules during sputtering, inhibiting abnormal discharge, and enabling stable DC sputtering.

The present invention is capable of prolonging the target life, reducing variation in the target quality and improving productivity. This In—Ga—Zn—O-based (IGZO) material is effective for use in a field-effect transistor since it is possible to obtain amorphous oxide having an electron carrier concentration of less than 10$^{18}$/cm$^3$. Its industrial applicability is high since the present invention can be used as an IGZO target for broad usages without any problem.

The invention claimed is:

1. An oxide sintered compact having a composition including In, Ga, Zn, and O and represented by a formula In$_2$Ga$_2$ZnO$_7$, wherein the oxide sintered compact contains gallium chloride as an impurity in an amount of 20 ppm or less and has a relative density of 99% or higher.

2. The oxide sintered compact according to claim 1, wherein the oxide sintered compact has a bulk resistance of 5.0×10$^{-2}$ Ωcm or less.

3. A method of producing an oxide sintered compact having a composition including In, Ga, Zn, and O and represented by a formula In$_2$Ga$_2$ZnO$_7$, wherein indium oxide, gallium oxide and zinc oxide raw material powders respectively containing gallium chloride in an amount of 20ppm or less are mixed and sintered to produce an oxide sintered compact containing gallium chloride as an impurity in an amount of 20 ppm or less and having a relative density of 99% or higher.

* * * * *